(12) United States Patent
Liu (10) Patent No.: US 8,046,728 B2
(45) Date of Patent: Oct. 25, 2011

(54) INTEGRATED CIRCUIT DESIGN METHOD APPLIED TO A PLURALITY OF LIBRARY CELLS AND INTEGRATED CIRCUIT DESIGN SYSTEM THEREOF

(75) Inventor: Chien-Cheng Liu, Hsinchu (TW)

(73) Assignee: Realtek Semiconductor Corp., Science Park, HsinChu (TW)

( * ) Notice: Subject to any disclaimer, the term of this patent is extended or adjusted under 35 U.S.C. 154(b) by 326 days.

(21) Appl. No.: 12/408,723

(22) Filed: Mar. 23, 2009

(65) Prior Publication Data

US 2009/0249274 A1 Oct. 1, 2009

(30) Foreign Application Priority Data

Mar. 25, 2008 (TW) .................... 97110570 A (51) Int. Cl.
*G06F 17/50* (2006.01)
(52) U.S. Cl. ........ 716/122; 716/120; 716/123; 716/127; 716/129; 716/130
(58) Field of Classification Search .................. 716/120, 716/122, 123, 127, 129, 130
See application file for complete search history.

(56) References Cited

U.S. PATENT DOCUMENTS

| | | | | |
|---|---|---|---|---|
| 5,822,214 A * | 10/1998 | Rostoker et al. | ............. | 716/123 |
| 6,308,307 B1 * | 10/2001 | Cano et al. | ............. | 257/207 |
| 6,446,245 B1 * | 9/2002 | Xing et al. | ............. | 716/120 |
| 6,499,135 B1 * | 12/2002 | Li et al. | ............. | 716/122 |
| 6,539,530 B1 * | 3/2003 | Torii | ............. | 716/127 |
| 6,581,201 B2 * | 6/2003 | Cano et al. | ............. | 716/111 |
| 6,725,443 B1 * | 4/2004 | Pang et al. | ............. | 716/127 |
| 7,093,222 B2 * | 8/2006 | Fujimoto | ............. | 326/101 |
| 7,249,336 B2 * | 7/2007 | Nagata et al. | ............. | 716/120 |
| 7,263,677 B1 * | 8/2007 | Teig et al. | ............. | 716/54 |
| 7,269,803 B2 * | 9/2007 | Khakzadi et al. | ............. | 716/120 |
| 7,565,638 B2 * | 7/2009 | Hoerold | ............. | 716/106 |
| 7,603,634 B2 * | 10/2009 | Sluss et al. | ............. | 716/138 |
| 7,689,963 B1 * | 3/2010 | Masleid et al. | ............. | 716/129 |
| 2002/0013931 A1 * | 1/2002 | Cano et al. | ............. | 716/1 |
| 2002/0073388 A1 * | 6/2002 | Orshansky et al. | ............. | 716/5 |
| 2004/0163067 A1 * | 8/2004 | Migliore et al. | ............. | 716/10 |
| 2005/0138595 A1 * | 6/2005 | Khakzadi et al. | ............. | 716/18 |
| 2007/0157144 A1 * | 7/2007 | Mai et al. | ............. | 716/10 |
| 2007/0180419 A1 * | 8/2007 | Sherlekar et al. | ............. | 716/9 |
| 2008/0120586 A1 * | 5/2008 | Hoerold | ............. | 716/9 |
| 2009/0187871 A1 * | 7/2009 | Cork | ............. | 716/11 |
| 2010/0117162 A1 * | 5/2010 | Rohrer et al. | ............. | 257/401 |

\* cited by examiner

*Primary Examiner* — Phallaka Kik
(74) *Attorney, Agent, or Firm* — Winston Hsu; Scott Margo (57) ABSTRACT

A first library cell and a second library cell each includes a plurality of metal layers, and a metal track direction of the odd metal layers of the first library cell is perpendicular to that of the odd metal layers of the second library cell. An integrated circuit design method applied to these library cells includes the steps of rotating the second library cell to cause the metal track direction of the odd metal layers of the second library cell to be parallel to that of the odd metal layers of the first library cell, and placing the first library cell and the second library cell in an identical integrated circuit design.

12 Claims, 10 Drawing Sheets

INTEGRATED CIRCUIT DESIGN METHOD APPLIED TO A PLURALITY OF LIBRARY CELLS AND INTEGRATED CIRCUIT DESIGN SYSTEM THEREOF

BACKGROUND OF THE INVENTION

1. Field of the Invention

The present invention relates to an integrated circuit design method and a related system, and more particularly, to an integrated circuit design method for improving placement and routing (P&R) by rotating a metal track direction of metal layers of ultra high speed cells.

2. Description of the Prior Art

With the development of semiconductor technology, conventional electronic elements (such as capacitors and resistors) can be integrated into a chip. Hence, during a semiconductor manufacturing process, an integrated circuit (IC) can be produced by connecting metals on the chip. Due to ICs being widely applied to miscellaneous electronic products, planning a floor plan, power plans, placements of the IC, and routing between elements have become an important topic of this field.

Figure 1:
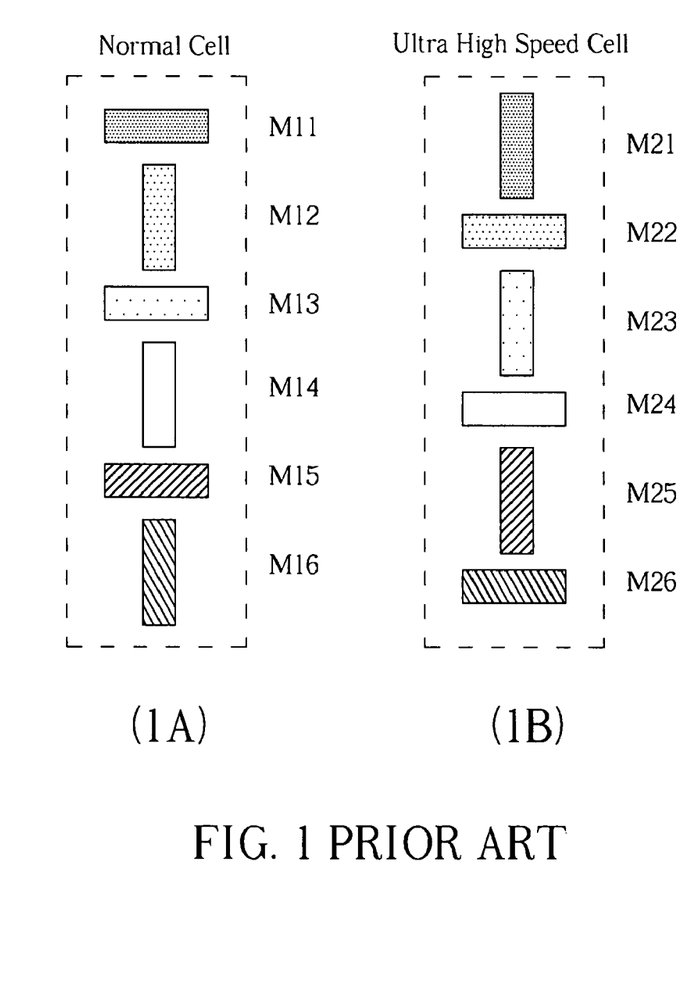
FIG. 1 (including 1A and 1B) is a diagram showing metal layers of a conventional normal cell and a conventional ultra high speed cell according to the prior art.
Figure 2:
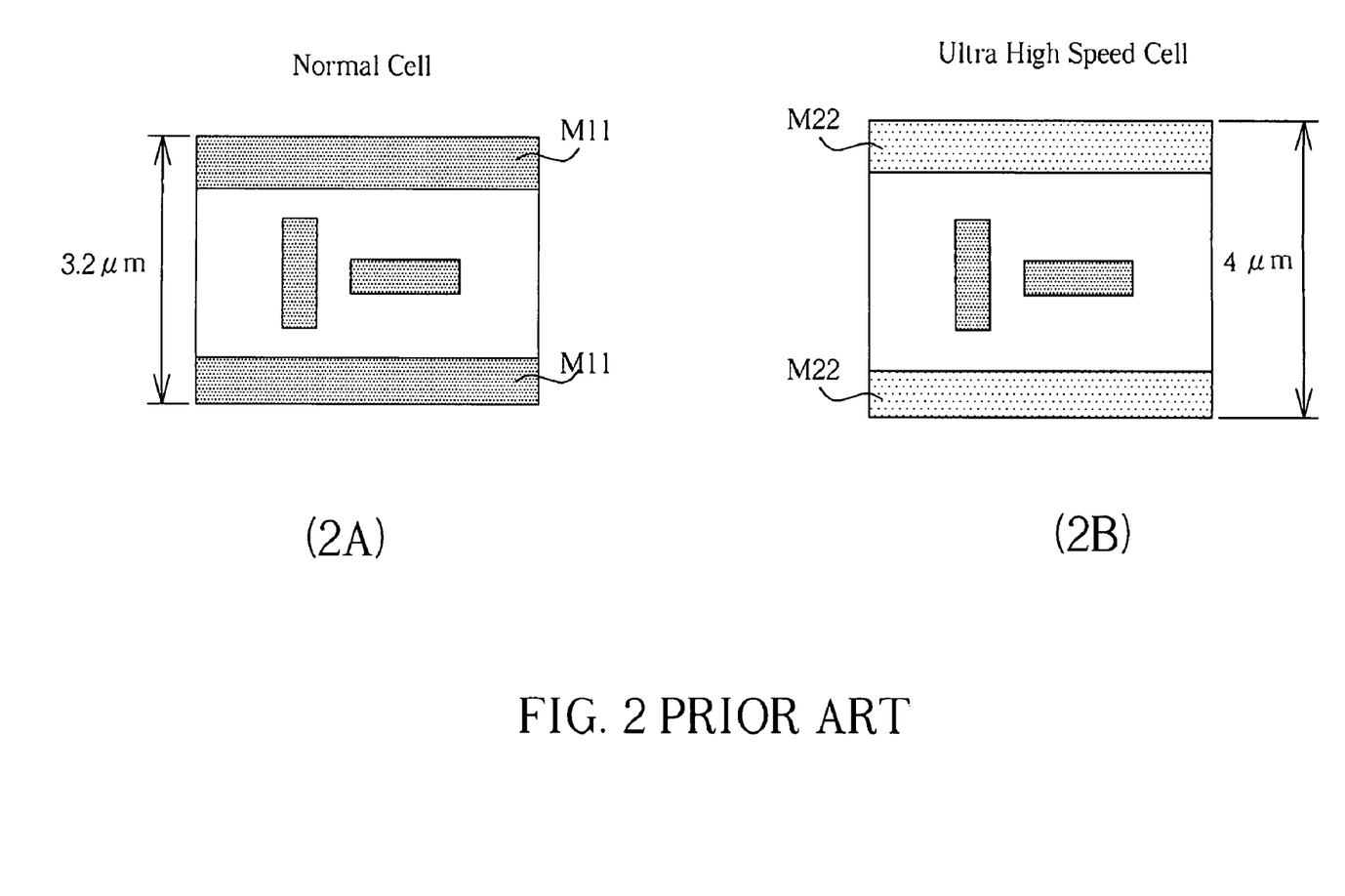
FIG. 2 (including 2A and 2B) is a diagram showing the power rails of the normal cell and the ultra high speed cell shown in FIG. 1.

IC design methods are divided into several kinds: full-custom design, gate array design, and standard cell design, wherein the standard cell design brings designed element modules together to form a large-scale circuit by utilizing a cell library. Pluralities of library cells are usually built in the cell library, wherein a normal cell and an ultra high speed cell are the most common library cells. Please refer to FIG. 1 and FIG. 2. FIG. 1 (including 1A and 1B) is a diagram showing metal layers of a conventional normal cell and a conventional ultra high speed cell according to the prior art. FIG. 2 (including 2A and 2B) is a diagram showing the power rails of the normal cell and the ultra high speed cell shown in FIG. 1. As shown in FIG. 1, the normal cell and the ultra high speed cell respectively consist of a plurality of metal layers. The normal cell consists of six metal layers M11-M16, as is shown in 1A. The ultra high speed cell consists of six metal layers M21-M26, as is shown in 1B. A metal track direction of the odd metal layers M11, M13, and M15 of the normal cell is perpendicular to that of the odd metal layers M21, M23, and M25 of the ultra high speed cell. A metal track direction of the even metal layers M12, M14, and M16 of the normal cell is perpendicular to that of the even metal layers M22, M22, and M26 of the ultra high speed cell. As shown in 2A, the power rail of the normal cell uses the first metal layer M11 as its power mesh and has a height of 3.2 µm. As shown in 2B, the power rail of the ultra high speed cell uses the second metal layer M22 as its power mesh and has a height of 4 µm.

However, if the conventional normal cell and the conventional ultra high speed cell are desired to be placed in the same IC design, extra wirings and extra vias are required to complete the power plans and the placement and routing (P&R) of the IC design due to the metal track directions of the normal cell being different from that of the ultra high speed cell. As a result, the cost is raised.

SUMMARY OF THE INVENTION

It is therefore one of the objectives of the claimed invention to provide an integrated circuit design method applied to a plurality of library cells and a related system, which solves the abovementioned problems by rotating a metal track direction of metal layers of ultra high speed cells.

According to an exemplary embodiment of the present invention, an integrated circuit design method applied to a plurality of library cells is provided. The library cells include a first library cell and a second library cell. Each of the first library cell and the second library cell respectively has a plurality of metal layers, and a metal track direction of the odd metal layers of the first library cell is perpendicular to that of the odd metal layers of the second library cell. The integrated circuit design method includes the steps: rotating the second library cell to make the metal track direction of the odd metal layers of the rotated second library cell parallel to that of the odd metal layers of the first library cell; and placing the first library cell and the second library cell in an identical integrated circuit design. The first library cell is a normal cell, and the second library cell is an ultra high speed cell. Alternatively, the first library cell is an ultra high speed cell, and the second library cell is a normal cell.

According to an exemplary embodiment of the present invention, an integrated circuit design system applied to a plurality of library cells is provided. The library cells include a first library cell and a second library cell. Each of the first library cell and the second library cell respectively has a plurality of metal layers, and a metal track direction of the odd metal layers of the first library cell is perpendicular to that of the odd metal layers of the second library cell. The integrated circuit design system includes a rotating module and an element placing module. The rotating module is used for rotating the second library cell to make the metal track direction of the odd metal layers of the rotated second library cell be parallel to that of the odd metal layers of the first library cell. The element placing module is used for placing the first library cell and the second library cell in an identical integrated circuit design.

These and other objectives of the present invention will no doubt become obvious to those of ordinary skill in the art after reading the following detailed description of the preferred embodiment that is illustrated in the various figures and drawings.

DETAILED DESCRIPTION

Figure 3:
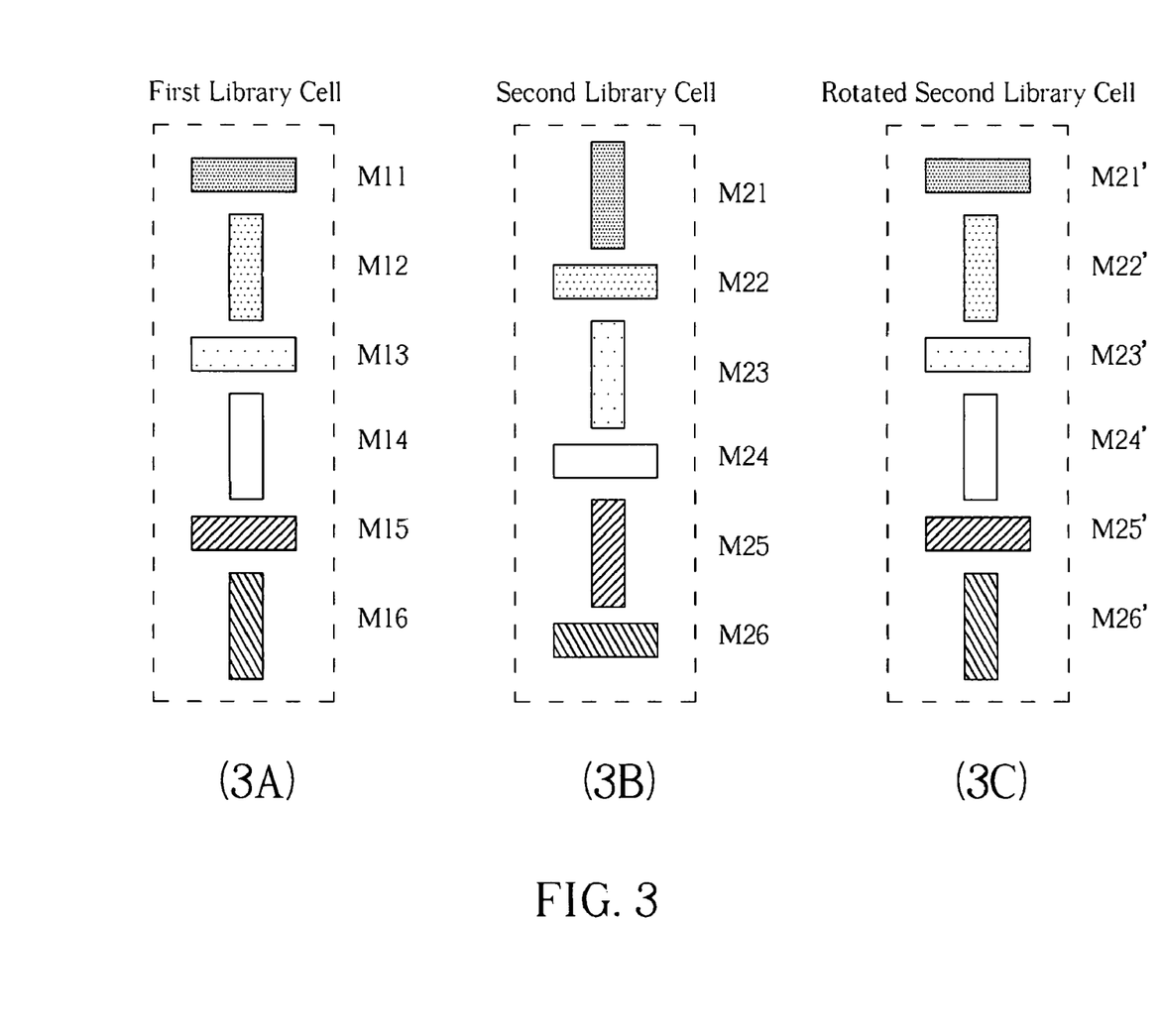
FIG. 3 (including 3A, 3B, and 3C) is a diagram showing metal layers of a first library cell, a second library cell, and a rotated second library cell according to an embodiment of the present invention.

Please refer to FIG. 3. FIG. 3 (including 3A, 3B, and 3C) is a diagram showing metal layers of a first library cell, a second library cell, and a rotated second library cell according to an embodiment of the present invention. The first library cell consists of six metal layers M11-M16, as is shown in 3A. The second library cell includes six metal layers M21-M26, as is shown in 3B. A metal track direction of the odd metal layers M11, M13, and M15 of the first library cell is perpendicular to that of the odd metal layers M21, M23, and M25 of the second library cell. A metal track direction of the even metal layers M12, M14, and M16 of the first library cell is perpendicular to that of the even metal layers M22, M24, and M26 of the second library cell. In order to solve the problem of different metal track directions, the second library cell needs to be rotated to make the metal track direction of the odd metal layers M21', M23', and M25' of the rotated second library cell be parallel to that of the odd metal layers M11, M13, and M15 of the first library cell. The metal track direction of the even metal layers M22', M24', and M26' of the rotated second library cell is parallel to that of the even metal layers M12, M14, and M16 of the first library cell, as is shown in 3C.

Figure 4:
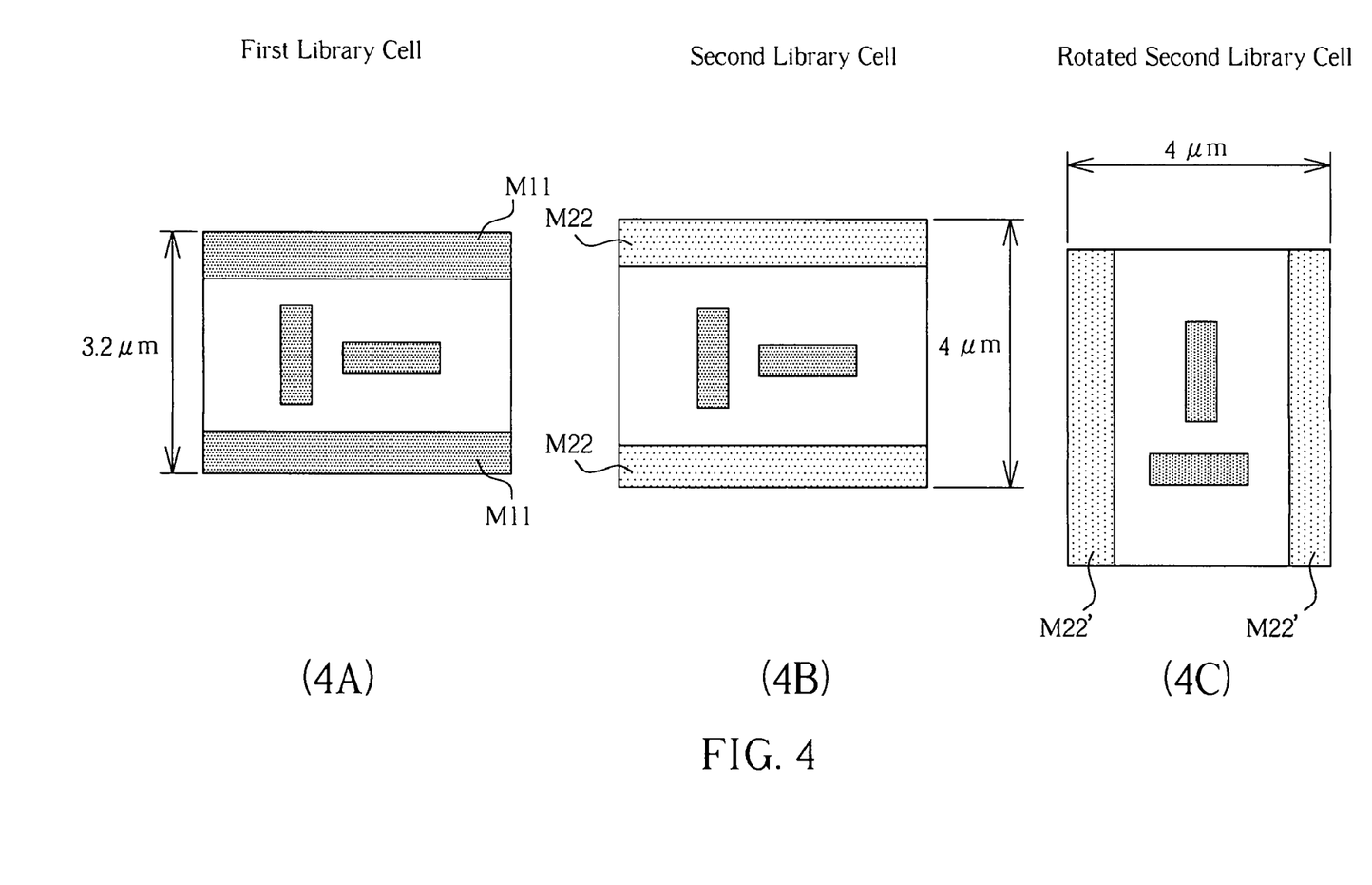
FIG. 4 (including 4A, 4B, and 4C) is a diagram showing the power rails of the first library cell, the second library cell, and the rotated second library cell shown in FIG. 3.

Please refer to FIG. 4. FIG. 4 (including 4A, 4B, and 4C) is a diagram showing the power rails of the first library cell, the second library cell, and the rotated second library cell shown in FIG. 3. The power rail of the first library cell uses the first metal layer M11 as its power mesh, as is shown in 4A. The power rail of the second library cell uses the second metal layer M22 as its power mesh, as is shown in 4B. The power rail of the rotated second library cell uses the second metal layer M22' as its power mesh, as is shown in 4C.

In the embodiment above, the first library cell can be a normal cell and the second library cell can be an ultra high speed cell, or the first library cell can be an ultra high speed cell and the second library cell can be a normal cell, but the configuration is not limited to this only and can be elements of other types. In addition, the abovementioned first library cell and the second library cell respectively consist of six metal layers. Those skilled in the art should understand that the number of the metal layers is not considered as a limitation of the present invention.

Figure 5:
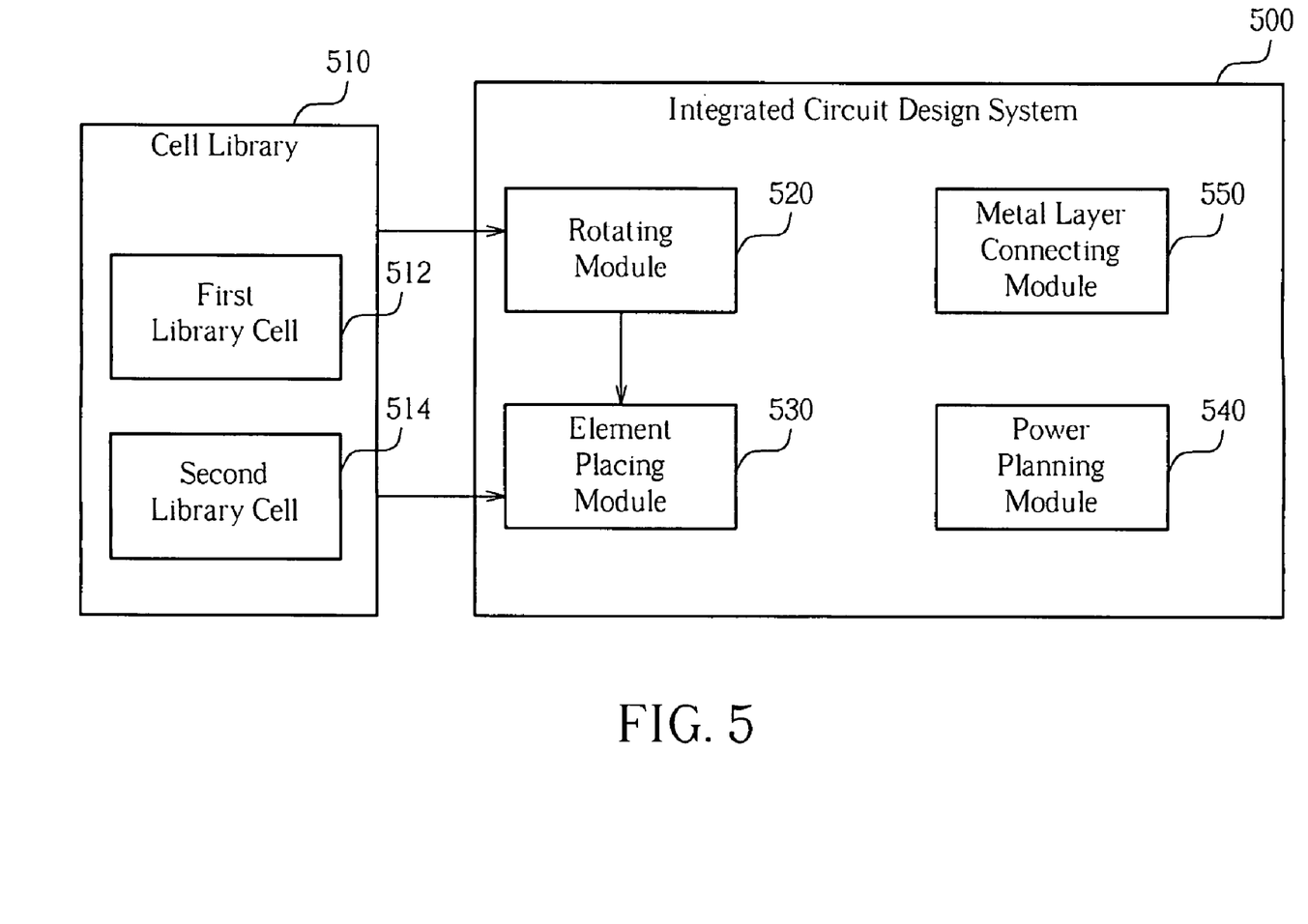
FIG. 5 is a diagram of an integrated circuit design system according to an embodiment of the present invention.

Please refer to FIG. 5. FIG. 5 is a diagram of an integrated circuit design system 500 according to an embodiment of the present invention. The integrated circuit design system 500 is coupled to a cell library 510. The cell library 510 includes a first library cell 512 and a second library cell 514, wherein the first library cell 512 and the second library cell 514 can be implemented by the first library cell and the second library cell shown in FIG. 3 and FIG. 4. The integrated circuit design system 500 includes a rotating module 520, an element placing module 530, a power planning module 540, and a metal layer connecting module 550. The rotating module 520 is coupled to the cell library 510 for rotating the second library cell 514 to make the metal track direction of the odd metal layers of the rotated second library cell 514 be parallel to that of the odd metal layers of the first library cell 512 and to make the metal track direction of the even metal layers of the rotated second library cell 514 be parallel to that of the even metal layers of the first library cell 512, as is shown in 3C. The element placing module 530 is coupled to the rotating module 520 and the cell library 510 for placing the first library cell and the rotated second library cell in an identical integrated circuit design. The first library cell 512 is placed in a first block within the integrated circuit design and the rotated second library cell 514 is placed in a second block within the integrated circuit design. The power planning module 540 plans power plans of the first block and the second block according to an identical metal track direction. The metal layer connecting module 550 directly connects a power rail of a designated metal layer within the rotated second library cell 514 to the power plan of the first block through vias.

Please note that the abovementioned integrated circuit design system 500 can be implemented by executing a P&R software tool using a computer, but this should not be considered as a limitation of the present invention. Those skilled in the art should appreciate the detailed operations and further descriptions are herein omitted. In addition, the cell library 510 can be disposed outside the integrated circuit design system 500 and is imported when being used, as is shown in FIG. 5. Alternatively, the cell library 510 can be built in the integrated circuit design system 500, and those skilled in the art should know that this is not a limitation of the present invention.

In the following, an example is taken to illustrate the applications and operations of the integrated circuit design method and system disclosed in the present invention. In addition, the integrated circuit design method and system disclosed in the present invention is compared with the conventional integrated circuit design method to further describe the advantages of the integrated circuit design method and system disclosed in the present invention.

Figure 6:
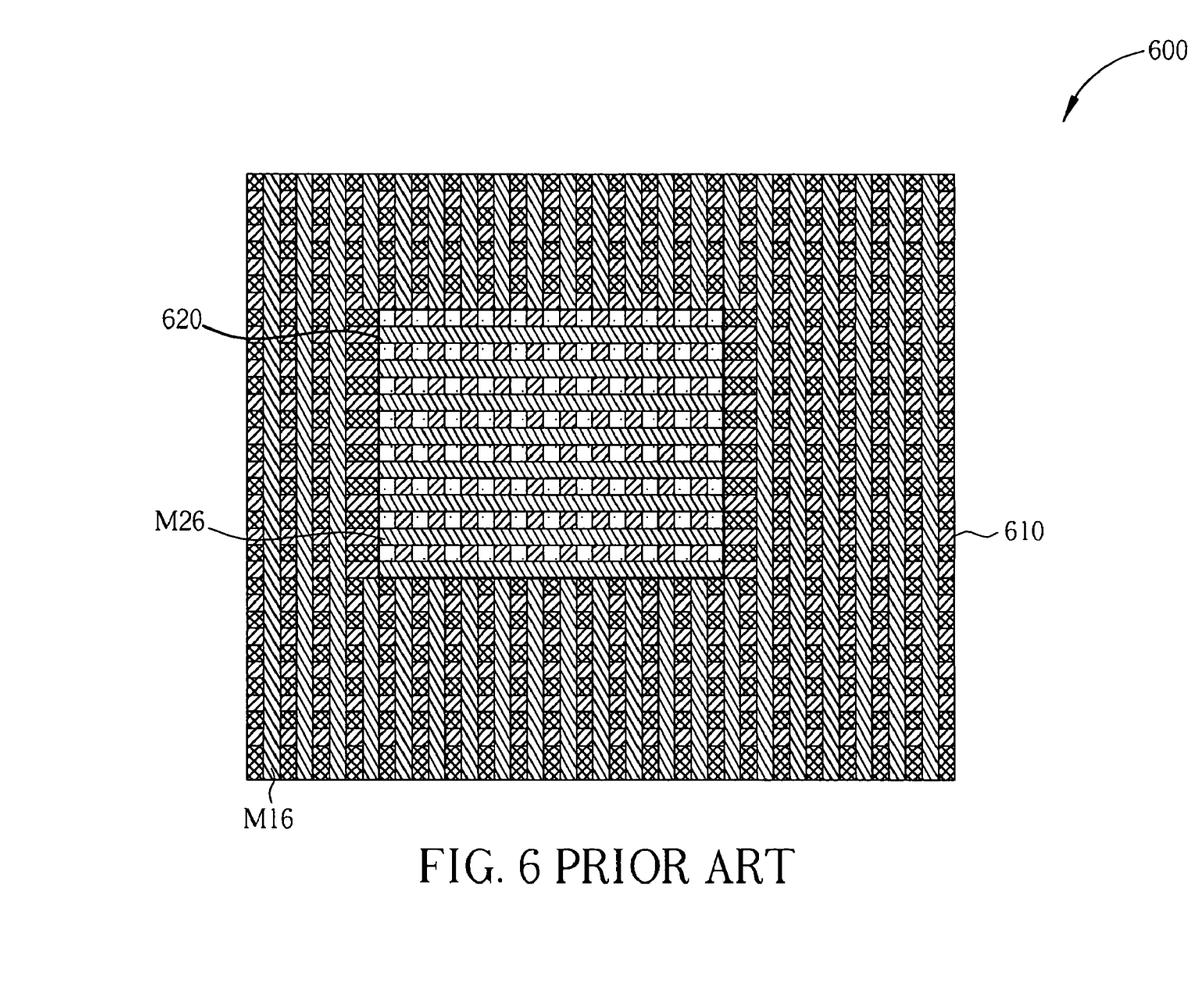
FIG. 6 is a diagram showing a first block and a second block within a conventional integrated circuit design according to the prior art.
Figure 7:
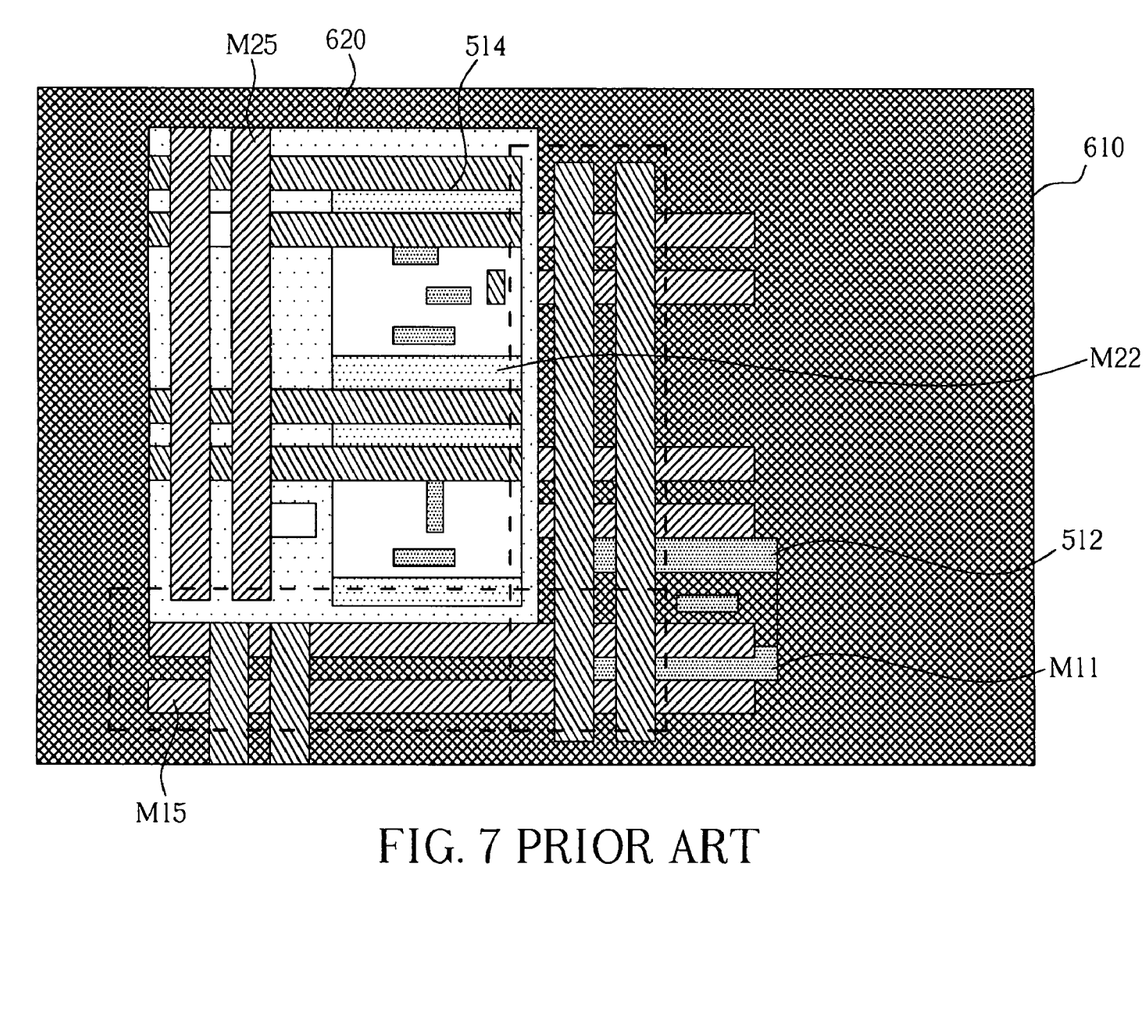
FIG. 7 is a diagram showing the detailed architecture and the power plans of the first block and the second block shown in FIG. 6.

Please refer to FIG. 6 and FIG. 7. FIG. 6 is a diagram showing a first block and a second block within a conventional integrated circuit design according to the prior art. FIG. 7 is a diagram showing the detailed architecture and the power plans of the first block and the second block shown in FIG. 6. As shown in FIG. 6, the integrated circuit design 600 is divided into a first block 610 and a second block 620, wherein the abovementioned first library cell 512 (i.e., a normal cell) is placed in the first block 610 and the second library cell 514 (i.e., an ultra high speed cell) is placed in the second block 620. As can be seen from FIG. 6, the metal track direction of the metal layers of the first library cell 512 is different from that of the second library cell 514. For example, the metal track direction of the sixth metal layer M16 located in the first block 610 is vertical, but the metal track direction of the sixth metal layer M26 located in the second block 620 is horizontal. Thus, the power plans of the first block 610 and the second block 620 need to be planned separately according to the different metal track directions.

As can be seen from FIG. 7, the power rail of the first library cell 512 uses the first metal layer M11 as its power mesh, but the power rail of the second library cell 514 uses the second metal layer M22 as its power mesh. The metal track directions of the metal layers located in the first block 610 are different from that located in the second block 620. Assuming that the fifth and sixth metal layers are used as power lines/ground lines of the power plans, the fourth metal layer is used for enhancing the power lines/ground lines of the power plans, and the first, second, and third metal layers are used as signal layers. If the power mesh of the first block 610 needs to be connected to that of the second block 620, extra processes on the first block 610 are required. For example, the second metal layer M22 of the second block 620 is firstly connected to the fifth metal layer M25 of the second block 620 through vias. Due to the metal track direction of the fifth metal track M25 in the second block 620 being different from that of the fifth metal layer M15 in the first block 610, extra routings are needed to connect them together. In other words, when planning the power plans of the first block 610 and the second block 620 by utilizing the conventional integrated circuit design method, they need to be planned separately according to the different metal track directions. Furthermore, when connecting the power meshes of the first block 610 and the second block 620, extra processes (extra routings) on the first block 610 are required.

Figure 8:
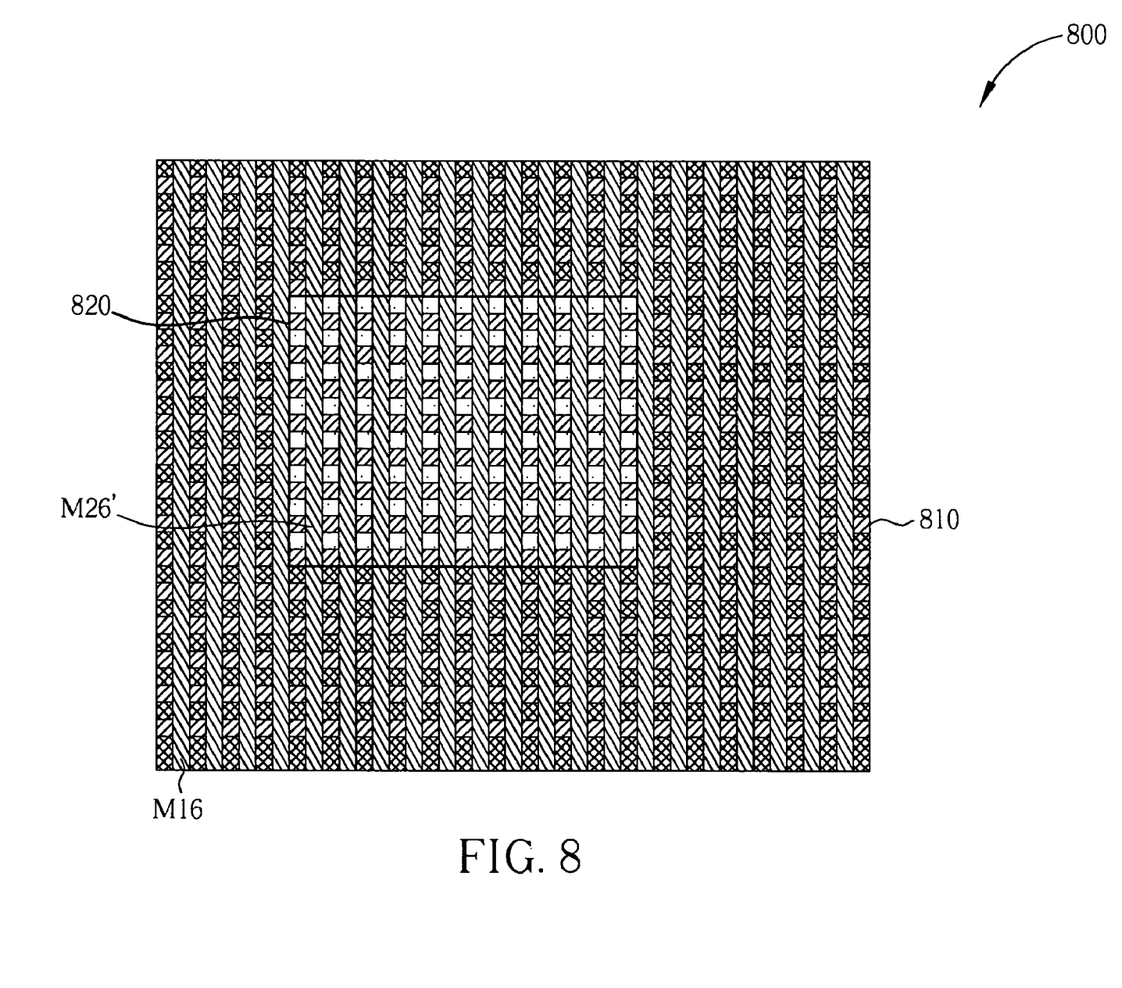
FIG. 8 is a diagram showing a first block and a second block within an integrated circuit design disclosed in the present invention.
Figure 9:
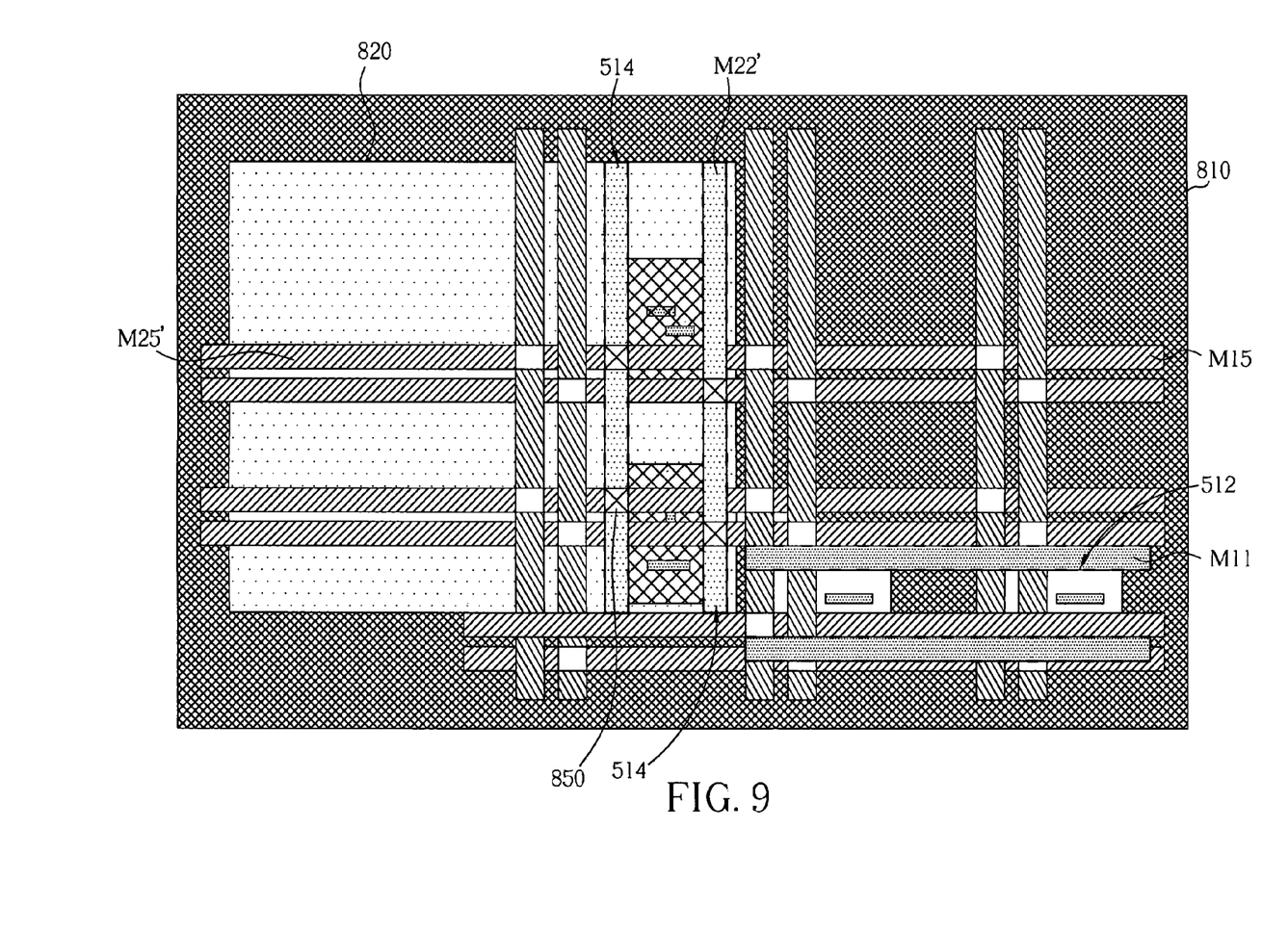
FIG. 9 is a diagram showing the detailed architecture and the power plans of the first block and the second block shown in FIG. 8.

Please refer to FIG. 8 and FIG. 9. FIG. 8 is a diagram showing a first block and a second block within an integrated circuit design disclosed in the present invention. FIG. 9 is a diagram showing the detailed architecture and the power plans of the first block and the second block shown in FIG. 8. As shown in FIG. 8, the integrated circuit design 800 is divided into a first block 810 and a second block 820, wherein the abovementioned first library cell 512 is placed in the first block 810 and the rotated second library cell 514 is placed in the second block 820. As can be seen from FIG. 8, the metal track direction of the metal layers of the first library cell 512 is the same as that of the rotated second library cell 514. For example, the metal track direction of the sixth metal layer M16 located in the first block 810 is vertical, and the metal track direction of the sixth metal layer M26' located in the second block 820 is vertical, too. Thus, the power plans of the first block 810 and the second block 820 can be planned simultaneously according to an identical metal track direction.

As can be seen from FIG. 9, the power rail of the first library cell 512 uses the first metal layer M11 as its power mesh, and the power rail of the rotated second library cell 514 uses the second metal layer M22' as its power mesh. The metal track directions of the metal layers located in the first block 810 are the same as that located in the second block 820. Assuming that the fifth and sixth metal layers are used as power lines/ground lines of the power plans, the fourth metal layer is used for enhancing the power lines/ground lines of the power plans, and the first, second, and third metal layers are used as signal layers. Thus, no extra processes are needed to connect the power meshes of the first block 810 and the second block 820 together. For example, due to the metal track direction of the fifth metal track M25' in the second block 820 being the same as that of the fifth metal layer M15 in the first block 810, the second metal layer M22' in the second block 820 can be directly connected to the fifth metal layer M15 in the first block 810 through vias. In other words, when planning the power plans of the first block 810 and the second block 820 by utilizing the integrated circuit design method disclosed in the present invention, they can be planned simultaneously according to the same metal track direction. Furthermore, when connecting the power meshes of the first block 810 and the second block 820, no extra routings are required.

Figure 10:
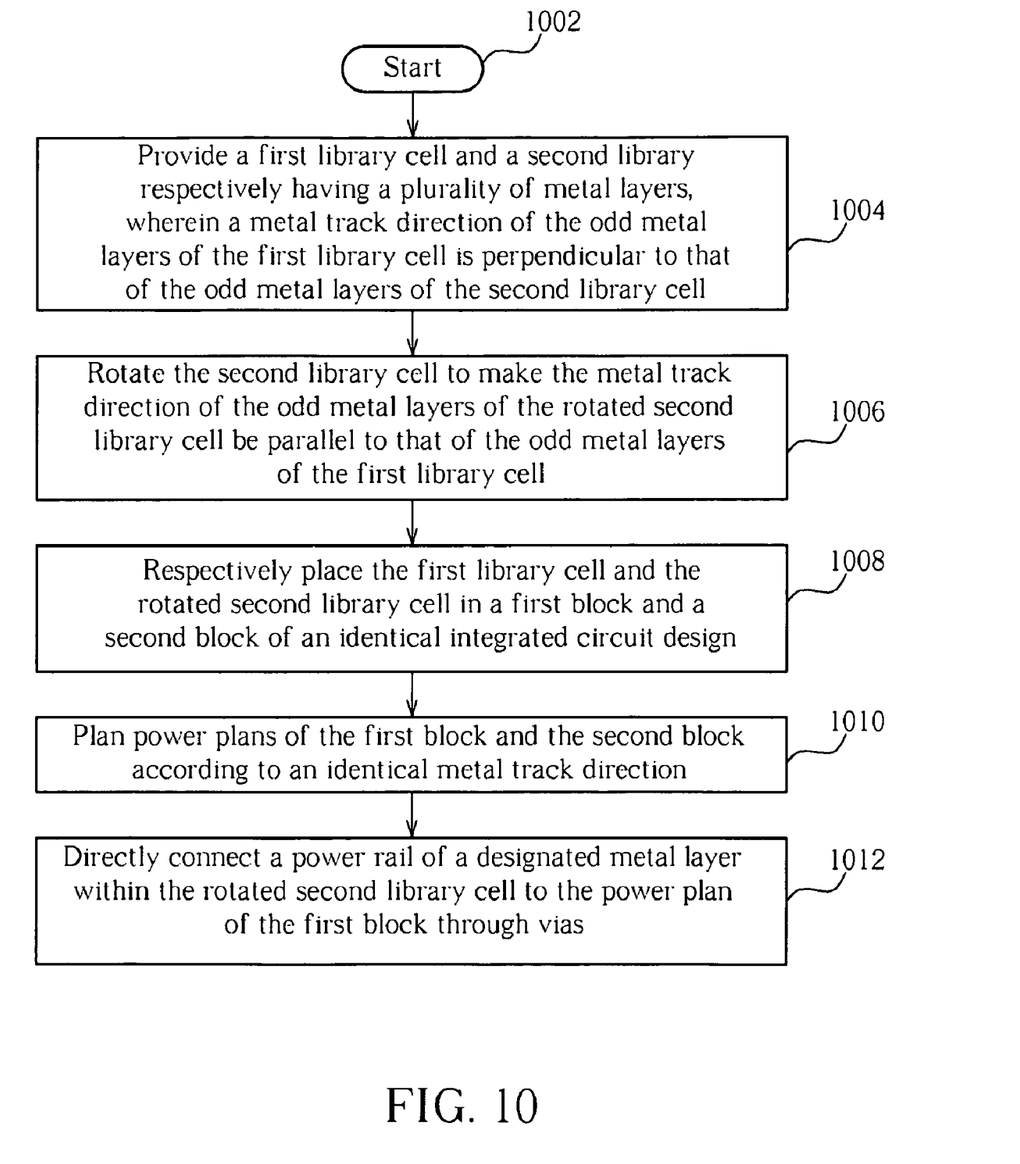
FIG. 10 is a flowchart illustrating an integrated circuit design method applied to a plurality of library cells according to an exemplary embodiment of the present invention.

Please refer to FIG. 10. FIG. 10 is a flowchart illustrating an integrated circuit design method applied to a plurality of library cells according to an exemplary embodiment of the present invention. Please note that the following steps are not limited to be performed according to the exact sequence shown in FIG. 10 if a roughly identical result can be obtained. The method includes the following steps:

Step 1002: Start.

Step 1004: Provide a first library cell and a second library respectively having a plurality of metal layers, wherein a metal track direction of the odd metal layers of the first library cell is perpendicular to that of the odd metal layers of the second library cell.

Step 1006: Rotate the second library cell to make the metal track direction of the odd metal layers of the rotated second library cell be parallel to that of the odd metal layers of the first library cell.

Step 1008: Respectively place the first library cell and the rotated second library cell in a first block and a second block of an identical integrated circuit design.

Step 1010: Plan power plans of the first block and the second block according to an identical metal track direction.

Step 1012: Directly connect a power rail of a designated metal layer within the rotated second library cell to the power plan of the first block through vias.

The following description details how each element operates by collocating the steps shown in FIG. 10, the elements shown in FIG. 5, and the figures of FIG. 8 and FIG. 9. In Step 1002, the first library cell 512 and the second library cell 514 are provided, wherein their metal track directions of metal layers are different. In Step 1006, the rotating module 520 rotates the second library cell 514 to make the metal track direction of the metal layers of the rotated second library cell 514 be parallel to that of the metal layers of the first library cell 512. The element placing module 530 respectively places the first library cell 512 and the second library cell 514 in the first block 810 and the second block 820 of the same integrated circuit design 800 (Step 1008, also shown in FIG. 8). The power planning module 540 plans power plans of the first block 810 and the second block 820 according to an identical metal track direction (Step 1010). The metal layer connecting module 550 then connects a power rail of a designated metal layer (i.e., M22') within the rotated second library cell 514 to the power plan (i.e., M15) of the first block 810 through vias 850 (Step 1012, also shown in FIG. 9).

Please note that the abovementioned steps are merely a practicable embodiment of the present invention, and in no way should be considered to be limitations of the scope of the present invention. It will be obvious to those skilled in the art that various modifications on the steps may be made without departing from the spirit of the present invention.

The abovementioned embodiments are presented merely for describing the present invention, and in no way should be considered to be limitations of the scope of the present invention. In summary, the present invention provides an integrated circuit design method applied to a plurality of library cells and related system. By rotating the second library cell 514, the metal track direction of the metal layers of the rotated second library cell 514 is parallel to that of the first library cell 512. Therefore, the power plans of the first block 810 and the second block 820 can be planned simultaneously according to an identical metal track direction. In addition, no extra routings are needed to connect the power meshes of the first block 810 and the second block 820 together. Not only can the issue of insufficient routing spaces be prevented, but also can the waste of manpower, time and cost be reduced, which is economical all round.

Those skilled in the art will readily observe that numerous modifications and alterations of the device and method may be made while retaining the teachings of the invention.

What is claimed is:

1. An integrated circuit design method applied to a plurality of library cells having a first library cell and a second library cell, where both the first library cell and the second library cell respectively have a plurality of metal layers, and a metal track direction of odd metal layers of the first library cell is perpendicular to that of odd metal layers of the second library cell, the integrated circuit design method comprising:

rotating the second library cell to make the metal track direction of odd metal layers of the rotated second library cell be parallel to that of the odd metal layers of the first library cell; and using a computer to place the first library cell and the rotated second library cell in an identical integrated circuit design.

2. The integrated circuit design method of claim 1, wherein the first library cell is placed in a first block within the integrated circuit design and the second library cell is placed in a second block within the integrated circuit design, and the integrated circuit design method further comprises:

planning power plans of the first block and the second block according to an identical metal track direction.

3. The integrated circuit design method of claim 2, further comprising:

directly connecting a power rail of a designated metal layer within the rotated second library cell to the power plan of the first block through vias.

4. The integrated circuit design method of claim 1, wherein the first library cell is a normal cell and the second library cell is an ultra high speed cell.

5. The integrated circuit design method of claim 1, wherein the first library cell is an ultra high speed cell and the second library cell is a normal cell.

6. The integrated circuit design method of claim 1, both the first library cell and the second library cell respectively comprise six metal layers.

7. An integrated circuit design system applied to a plurality of library cells having a first library cell and a second library cell, the first library cell and the second library cell respectively having a plurality of metal layers, and a metal track direction of odd metal layers of the first library cell being perpendicular to that of odd metal layers of the second library cell, the integrated circuit design system comprising:

a rotating module, for rotating the second library cell to make the metal track direction of odd metal layers of the rotated second library cell be parallel to that of the odd metal layers of the first library cell; and an element placing module, for placing the first library cell and the rotated second library cell in an identical integrated circuit design.

8. The integrated circuit design system of claim 7, wherein the element placing module places the first library cell in a first block within the integrated circuit design and places the second library cell in a second block within the integrated circuit design, and the integrated circuit design system further comprises:

a power planning module, for planning power plans of the first block and the second block according to an identical metal track direction.

9. The integrated circuit design system of claim 8, further comprising:

a metal layer connecting module, for directly connecting a power rail of a designated metal layer within the rotated second library cell to the power plan of the first block through vias.

10. The integrated circuit design system of claim 7, wherein the first library cell is a normal cell and the second library cell is an ultra high speed cell.

11. The integrated circuit design system of claim 7, wherein the first library cell is an ultra high speed cell and the second library cell is a normal cell.

12. The integrated circuit design system of claim 7, wherein both the first library cell and the second library cell respectively comprise six metal layers.

* * * * *